United States Patent [19]
Satish

[11] Patent Number: 5,640,404
[45] Date of Patent: Jun. 17, 1997

[54] LIMITED PROBES DEVICE TESTING FOR HIGH PIN COUNT DIGITAL DEVICES

[75] Inventor: Keshava I. Satish, Union City, Calif.

[73] Assignee: VLSI Technology, Inc., San Jose, Calif.

[21] Appl. No.: 693,853

[22] Filed: Aug. 5, 1996

[51] Int. Cl.$^6$ .................................................. G01R 31/28
[52] U.S. Cl. ........................... 371/22.3; 395/183.06
[58] Field of Search .............................. 371/22.3, 22.1, 371/22.8, 25.1; 395/183.06; 324/73.1

[56] References Cited

U.S. PATENT DOCUMENTS

| | | | |
|---|---|---|---|
| 5,396,170 | 3/1995 | D'Souza et al. | 324/158.1 |
| 5,428,624 | 6/1995 | Blair et al. | 371/22.3 |
| 5,477,545 | 12/1995 | Huang | 371/22.3 |
| 5,592,493 | 1/1997 | Crouch et al. | 371/22.3 |

*Primary Examiner*—Vincent P. Canney
*Attorney, Agent, or Firm*—Douglas L. Weller

[57] ABSTRACT

An integrated circuit is tested when input/output pads of the integrated circuit are unconnected to any external device. In order to do this, for each of a subset of the unconnected input/output pads, a boundary scan register is provided. A test vector is scanned serially into the boundary scan registers. The test vector may then be applied to internal logic of the integrated circuit. While the test is in progress, the value contained within each boundary scan register is applied to an associated input/output pad so that, as a result, the test vector is applied to the subset of the unconnected input/output pads.

13 Claims, 11 Drawing Sheets

LIMITED PROBES DEVICE TESTING FOR HIGH PIN COUNT DIGITAL DEVICES

BACKGROUND

This invention relates generally to testing digital semiconductor devices and pertains particularly to providing limited probes device testing for high pin count digital devices.

To assure high reliability, it is necessary when designing complex digital application specific integrated circuits (ASIC's) to design in testability. Testability is a property of a circuit, board or system that enables non-destructive testing. Custom and complex digital ASIC's often have a very high pin count which requires very high pin count conventional automatic test equipment (ATE) to perform comprehensive testing. However it is very expensive to build and maintain a high pin count ATE machine to support testing of high pin count digital ASIC's.

Design for test (DFT) techniques seek to reduce the complexity of design for test purposes and to keep the cost of test generation within reasonable bounds. The object of DFT is to improve the reliability of hardware.

Scan design is a DFT technique which utilizes a scan storage element, such as a specialized flip-flop or latch, that allows data to be scanned in for control and to be scanned out for observation and can be activated in scan mode for test purposes. The scan storage elements are generally connected in serial fashion to form an internal scan chain.

Boundary scan is a test technique which uses shift registers (scan flip-flops) placed adjacent to each device signal pin and the internal logic. These shift registers can control and observe signal values present at each input and output pin and are connected together in serial fashion to form a Data Register (DR) chain called a boundary scan register (BSR) chain. For general information on the use of boundary scan registers, see for example, "The Test Access Port and Boundary-Scan Architecture", Published by IEEE Computer Society Press; IEEE Std 1149.1-1990, IEEE, Inc. 345 E. 47th St., New York, N.Y. 10017, October 1993; U.S. Pat. No. 5,115,191, issued to T. Yoshimori for "Testing Integrated Circuit Capable of Easily Performing Parametric Test on High Pin Count Semiconductor Device", May 19, 1992; U.S. Pat. No. 5,412,260 issued to C. Tsui for "Multiplexed Control Pins For In-System Programming And Boundary Scan State Machines In A High Density Programmable Logic Device", on May 2, 1995.

Current circuits used for boundary scan test techniques are designed for use when the circuit is connected within a board or system. During testing, the input pins of each integrated circuit within a board being tested are held to appropriate voltage levels.

However, when individual circuits, such as complement metal oxide semiconductor (CMOS) devices, are tested before being attached to a circuit board, for example, when individual circuits are tested during wafer sort, the input pads of the circuits float when not held to appropriate voltage levels either by automatic test equipment or other means. This makes the use of boundary scan techniques impractical for use when testing circuits that are not yet placed in a circuit board.

SUMMARY OF THE INVENTION

In accordance with a preferred embodiment of the present invention an integrated circuit is tested when input and output pads of the integrated circuit are unconnected to any external device. In order to do this, for each of a subset of the unconnected input and output pads, a boundary scan register is provided. A test vector is scanned serially into the boundary scan registers. The test vector may then be applied to internal logic of the integrated circuit. While the test is in progress, the value contained within each boundary scan register is also applied to an associated input pad so that the input pads of the device do not float.

In the preferred embodiment, when a response value of the internal logic of the integrated circuit is captured into each boundary scan register associated with an output pad, the value contained within each input pad boundary scan register continues to be applied to the internal logic through the associated input pad. The response value can then be serially scanned out of the boundary scan registers for observation.

In order to implement the above-described testing methodology, boundary scan registers are designed with additional functionality. For example, boundary scan registers that are to be connected to input pad type signals are designed to include a gate which connects the output of the boundary scan register and the associated pad during wafer testing. Additionally, a selection means such as a multiplexor, is used to allow the output of the internal logic of the device to serve as input to the boundary scan register. This increases the testability of the boundary scan circuit.

The present invention allows limited probes device testing for high pad count digital devices while the pads of the device remain unconnected to an external ATE. This greatly increases the ability and economy of testing devices during wafer sorting.

DESCRIPTION OF A PREFERRED EMBODIMENT

Figure 1:
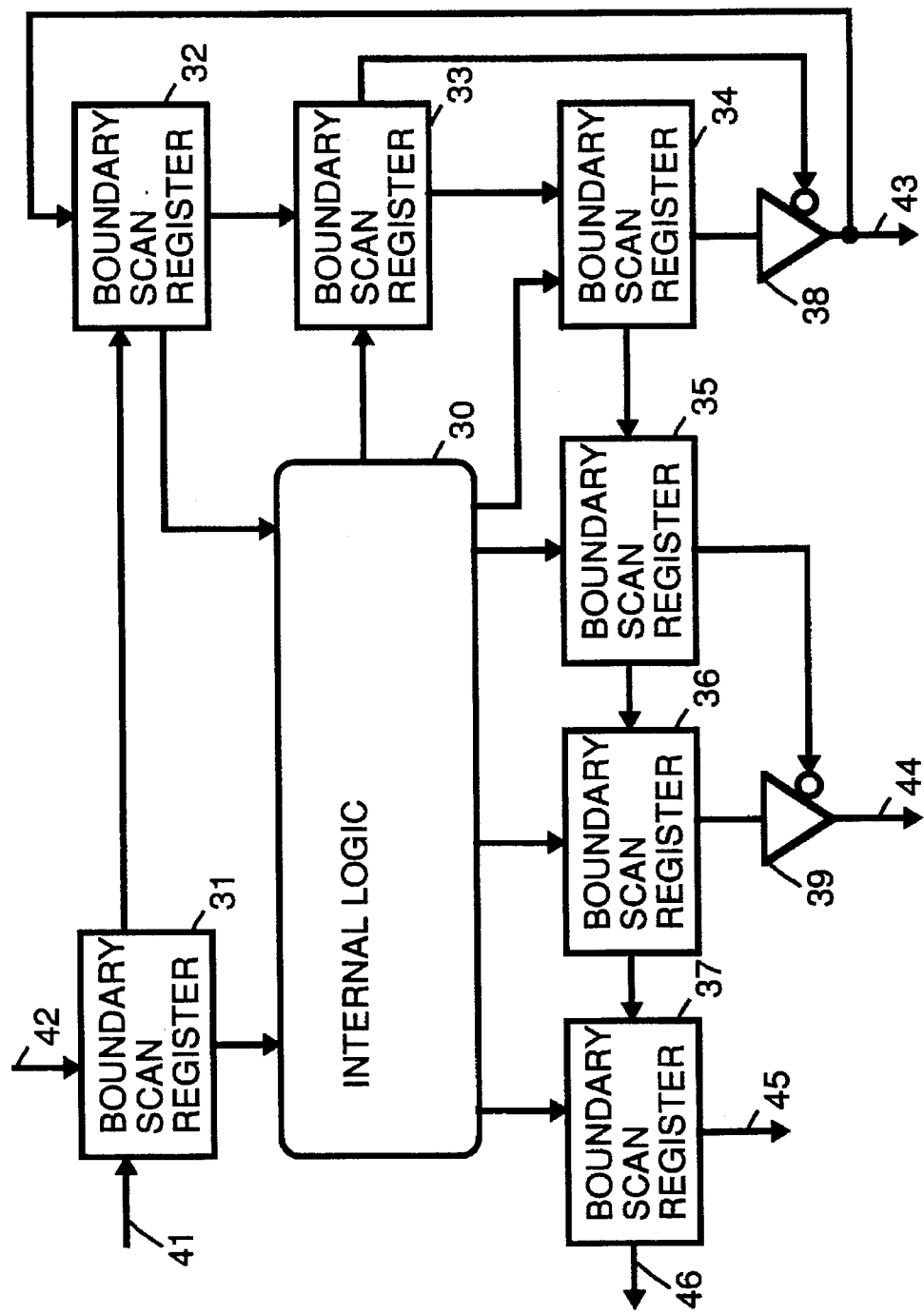
FIG. 1 shows various ways boundary scan registers can be connected in an application specific integrated circuit.

FIG. 1 shows a boundary scan register 31, a boundary scan register 32, a boundary scan register 33, a boundary scan register 34, a boundary scan register 35, a boundary scan register 36 and a boundary scan register 37 connected together and to internal logic 30. Boundary scan register 31 functions with input pin 42 as an input pin boundary scan register. Boundary scan registers 32, 33 and 34 are connected to a tri-state logic gate 38. Tri-state gate 38 is connected to a bi-directional pin 43. Boundary scan registers 35 and 36 are connected to a tri-state logic gate 39. Tri-state gate 39 is connected to a tri-state pin 44. Boundary scan register 37 is connected to an output pin 45.

Test vector sets generated by an automatic test pattern generator (ATPG) are scanned in through an input port 41 so that test stimuli may be applied in parallel by boundary scan registers 31, 32 and 33 to internal logic 30. Circuit response is captured in parallel by boundary scan registers 33 through 37 and scanned out through an output port 46.

Figure 2:
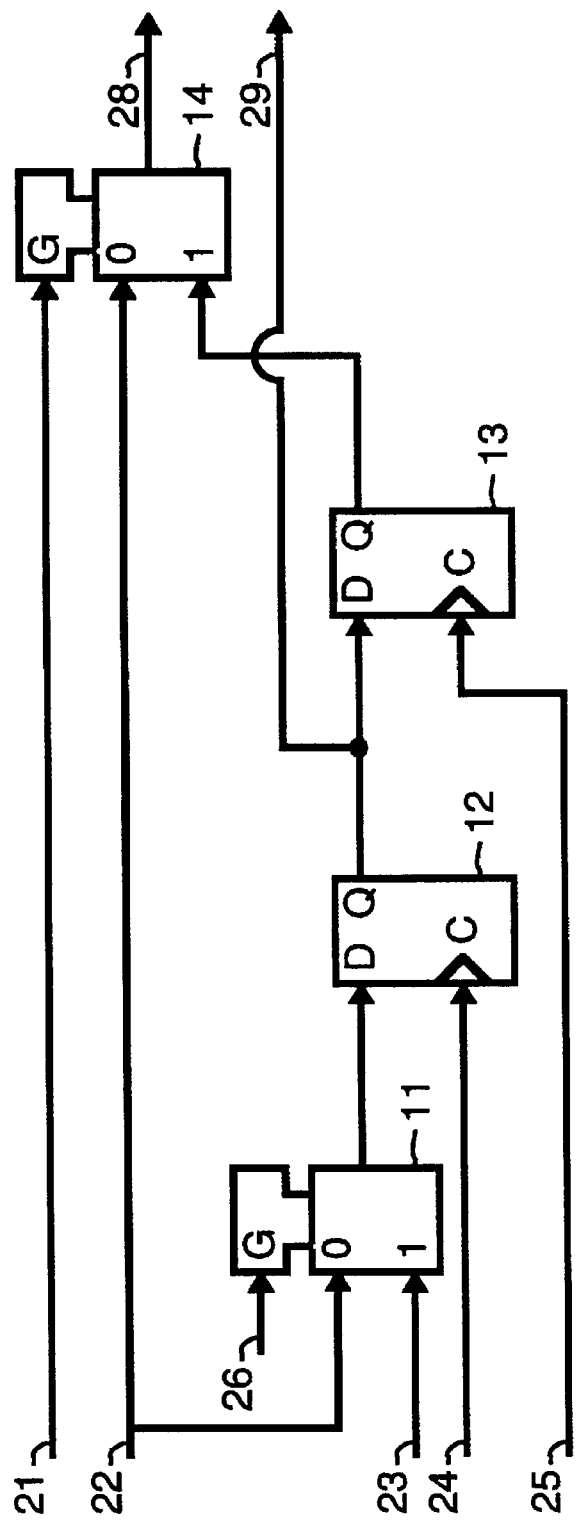
FIG. 2 shows a generic boundary scan register in accordance with the prior art.

FIG. 2 shows a generic boundary scan register in accordance with the prior art. The boundary scan register can be used for either an input pin or an output pin and provides controllability or observability of the signal flowing through the pin. Controllability is the ability to establish a specific signal logic value either low or high at each node in a circuit by setting values on the inputs of the circuit. Observability is the ability to determine the signal value at any node in a circuit by controlling the circuits inputs and observing its outputs. Predictability is the ability to obtain known output logic values in response to given input stimuli.

The boundary scan register shown in FIG. 2 includes a delay (D) flip-flop 12 which operates as a shift stage. A D flip-flop 13 operates as an update stage. A Clock-DR signal on line 24 is used to clock D flip-flop 12. An Update-DR dock signal on a line 25 is used to dock D flip-flop 13. The output of D flip-flop 12 (shift stage) is connected to the D input of flip-flop 13 (update stage). A scan out signal is placed on a line 29. The update stage acts as a latch which prevents the output pins of the device from rippling as data is shifted through the boundary scan registers during the scan operation. A multiplexor 14 selects either data on an input line 22 or output from D flip-flop 13 to place on an output line 28. Multiplexor 14 is controlled by a mode line 21 (test/normal). A multiplexor 11 selects either data on input line 22 or data from scan-in line 23 to place as input to D flip-flop 12. Multiplexor 11 is controlled by a mode line 26 (shift/load).

The boundary scan shift registers are linked together serially using scan input line 23 and scan output line 29. Depending on how the boundary scan register is used, (either to input signal type or output signal type) input line 22 is connected either to an input pad or to an output of the internal logic of the device. Likewise, output line 28 is connected either to an input to the internal logic or to an output pad of the device.

Figure 3:
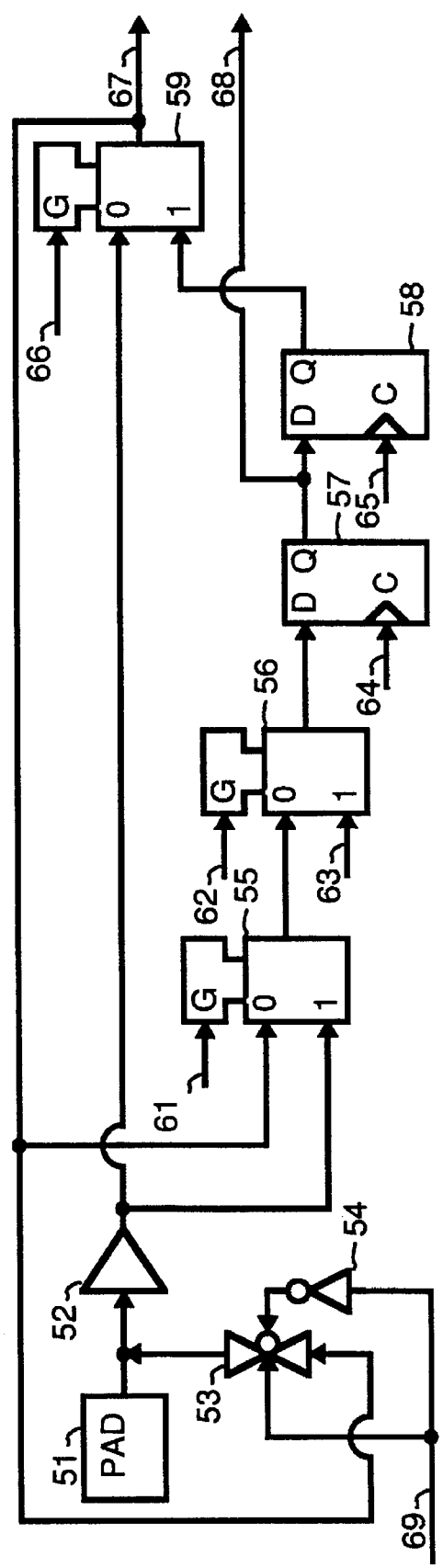
FIG. 3 shows boundary scan register that can be connected to an input signal of a device in accordance with a preferred embodiment of the present invention.

FIG. 3 shows boundary scan register that can be connected to an input signal of a device in accordance with a preferred embodiment of the present invention. The input pin boundary scan register supports both controllability and observability for the input signal. The input pin boundary scan register includes a delay (D) flip-flop 57 which operates as a shift stage and a D flip-flop 58 which operates as an update stage. A Clock-DR signal on line 64 is used to dock D flip-flop 57. An Update-DR dock signal on a line 65 is used to clock D flip-flop 58. The Q output of flip-flop 57 is connected to the D input of flip-flop 58. A scan out signal is placed on a line 68. A multiplexor 59 selects either data from pad 51 or output from D flip-flop 58 to place on an output line 67. Multiplexor 59 is controlled by a Mode-one line 66.

A multiplexor 56 selects either data from a multiplexor 55 or data from a scan-in line 63 to place as input to D flip-flop 57. Multiplexor 56 is controlled by a Shift/Load mode line 62.

A multiplexor 55 selects either data from output line 67 or data from amplifier 52 to forward to multiplexor 56. Multiplexor 55 is controlled by a Mode-two line 61. The remaining circuitry within the input pin boundary scan register are used to provide a scanned in logic value through gate 53 on pad 51 during the test period. This prevents input pad 51 from floating during testing. This alleviates the need for input pad to be driven by the pin electronics of an automatic test equipment machine. The required logic value for each input signal can be scanned into the update stage and driven to the internal logic and also captured. A WS line 69 is used with a not gate 54 to control a gate 53. When gate 53 is opened, the logic value on output line 67 is applied on pad 51. An amplifier 52 is used to forward the logic value on pad 51 to the internal logic and to the multiplexors.

Figure 4:
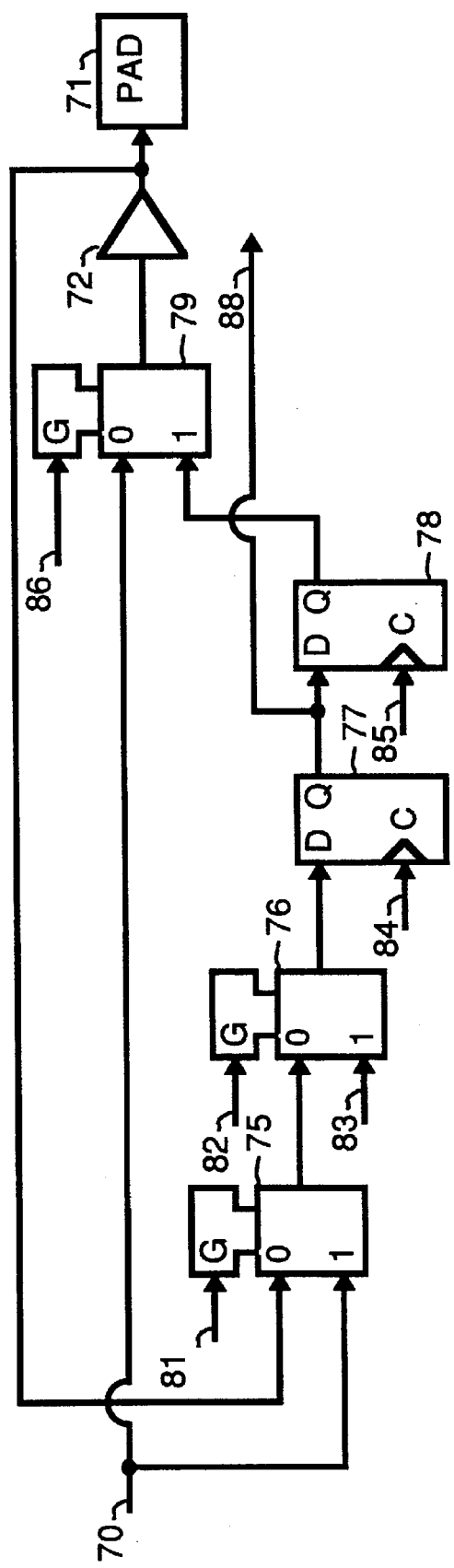
FIG. 4 shows boundary scan register that can be connected to an output signal of a device in accordance with a preferred embodiment of the present invention.

FIG. 4 shows boundary scan register that can be connected to an output signal of a device in accordance with a preferred embodiment of the present invention. The output pin boundary scan register supports both controllability and observability for the output signal. The output pin boundary scan register includes a D flip-flop 77 which operates as a shift stage and a D flip-flop 78 which operates as an update stage. A Clock-DR signal on line 84 is used to clock D flip-flop 77. An Update-DR clock signal on a line 85 is used to clock D flip-flop 78. The Q output of flip-flop 77 is connected to the D input of flip-flop 78. A scan out signal is placed on a line 88. A multiplexor 79 selects either data from a core out line 70 or output from flip-flop 78 to forward through amplifier 72 to an output pad 71. Multiplexor 79 is controlled by a Mode-one line 86. A multiplexor 76 selects either data from a multiplexor 75 or data from a scan-in line 83 to place as input to D flip-flop 77. Multiplexor 76 is controlled by a Shift/Load mode line 82. A multiplexor 75 selects either data from the output of amplifier 72 or data from core out line 70 to forward to multiplexor 76. Multiplexor 75 is controlled by a Mode-two line 81.

This type of the output pin boundary scan register allows the output signal to be captured into the shift stage and scanned out for observation such that pin electronics of an ATE machine need not be connected to this type of output pin boundary scan register.

Figure 5:
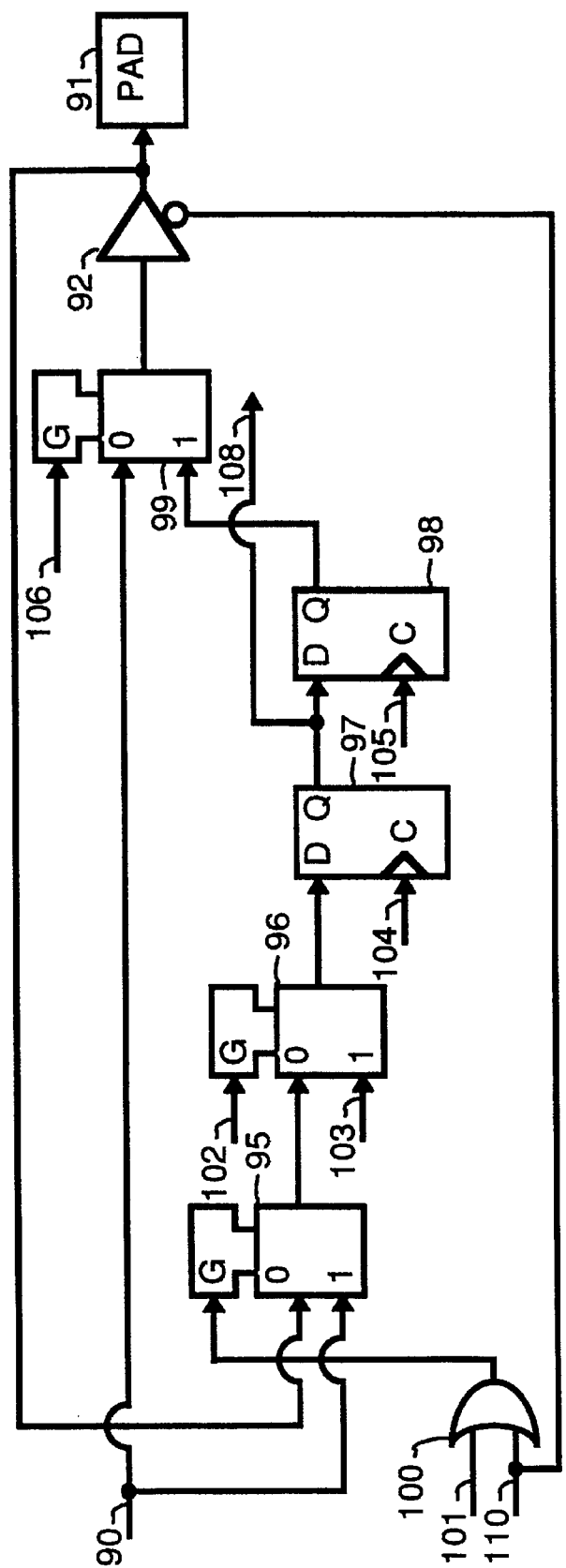
FIG. 5 shows a boundary scan register that can be connected to a tri-state signal of a device in accordance with a preferred embodiment of the present invention.

FIG. 5 shows a boundary scan register that can be connected to a tri-state signal of a device in accordance with a preferred embodiment of the present invention. The tri-state pin boundary scan register supports both controllability and observability for the output signal. The tri-state pin boundary scan register includes a D flip-flop 97 which operates as a shift stage. A D flip-flop 98 operates as an update stage. A Clock-DR signal on line 104 is used to clock D flip-flop 97. An Update-DR clock signal on a line 105 is used to dock D flip-flop 98. The Q output of flip-flop 97 is connected to the D input of flip-flop 98. A scan out signal is placed on a line 108. A multiplexor 99 selects either data from a core out line 90 or output from flip-flop 98 to forward to the input of tri-state gate 92. Multiplexor 99 is controlled by a Mode-one line 106. A multiplexor 96 selects either data from a multiplexor 95 or data from a scan-in line 103 to place as input to D flip-flop 97. Multiplexor 96 is controlled by a Shift/Load mode line 102. A multiplexor 95 selects either data from core out line 90 or data on pad 91 to forward to multiplexor 96. Multiplexor 95 is controlled by an output of a logic OR gate 100. Logic OR gate 100 performs a logic OR of signals on a Mode-two line 101 and an output enable (oen) line 110. The enable (oen) line 110 is used to control tri-state gate 92.

This type of tri-state pin boundary scan register allows the output signal to be captured into the shift stage and scanned out for observation such that pin electronics of an ATE machine need not be connected to this type of tri-state pin boundary scan register.

Figure 6:
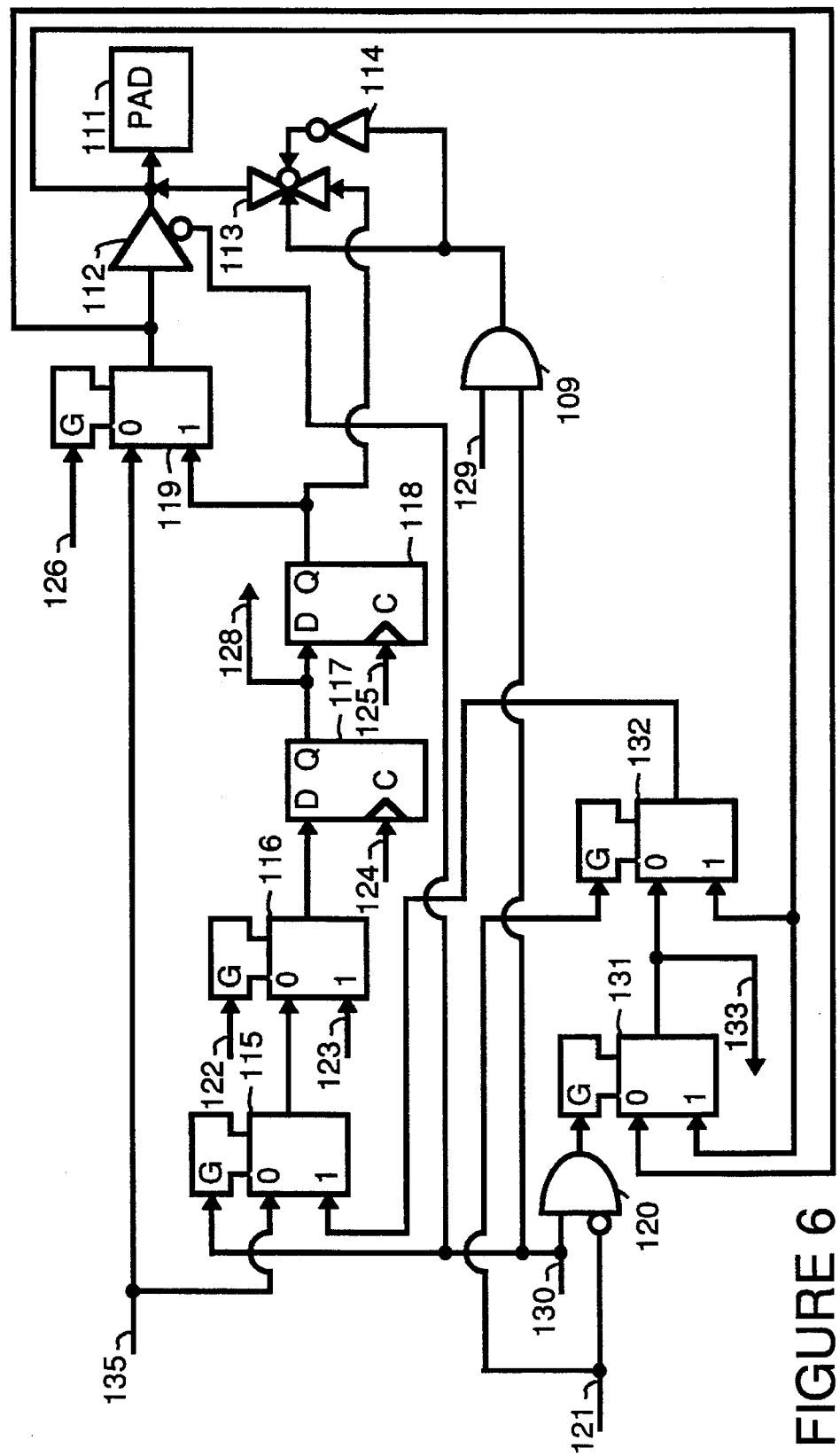
FIG. 6 shows a boundary scan register that can be connected to a bi-directional signal of a device in accordance with a preferred embodiment of the present invention.

FIG. 6 shows a boundary scan register that can be connected to a bi-directional signal of a device in accordance with a preferred embodiment of the present invention. The bi-directional pin boundary scan register supports both controllability and observability for the input/output signal. The bi-directional pin boundary scan register includes a D flip-flop 117 which operates as a shift stage. A D flip-flop 118 operates as an update stage. A Clock-DR signal on line 124 is used to clock D flip-flop 117. An Update-DR clock signal on a line 125 is used to clock D flip-flop 118. The Q output of flip-flop 117 is connected to the D input of flip-flop 118. A scan out signal is placed on a line 128. A multiplexor 119 selects either data from a core out line 135 or output from D flip-flop 118 to forward to the input of tri-state gate 112. Multiplexor 119 is controlled by a Mode-one line 126. A multiplexor 116 selects either data from a multiplexor 115 or data from a scan-in line 123 to place as input to D flip-flop 117. Multiplexor 116 is controlled by a Shift/Load mode line 122.

A WS line 129 is used with a logic AND gate 109 and a not gate 114 to control a gate 113. When gate 113 is opened, the logic value on the output of D flip-flop 118 is applied on pad 111. Tri-state gate 112 is used to gate the logic value on pad 111. A multiplexor 115 selects either data from core out line 135 or data from a multiplexor 132 to forward to multiplexor 116. Multiplexor 115 is controlled by an output enable (oen) line 130. A multiplexor 132 selects either data from input/output pad 111 or data from a multiplexor 131 to forward to multiplexor 115. Multiplexor 132 is controlled by a Mode-two line 121. A multiplexor 131 selects either data from multiplexor 119 or data from input/output pad 111 to forward to multiplexor 132. Multiplexor 131 is controlled by the output of a logic AND gate 120. Multiplexor 131 provides a signal for a core-in signal line 133. Logic AND gate 120 performs a logic AND of an inverse of the signal on Mode-two line 121 and the signal on output enable (oen) line 130. The signal on oen line 130 is also used to control tri-state gate 112.

This type of bi-directional pin boundary scan register allows the input/output signal to be captured into the shift stage and scanned out for observation. In the input mode the update state flip-flop is used to provide a logic value on pad 111 as necessary during the test period. The result is that pin electronics of an ATE machine need not be connected to this type of bi-directional pin boundary scan register during the test period.

Figure 7:
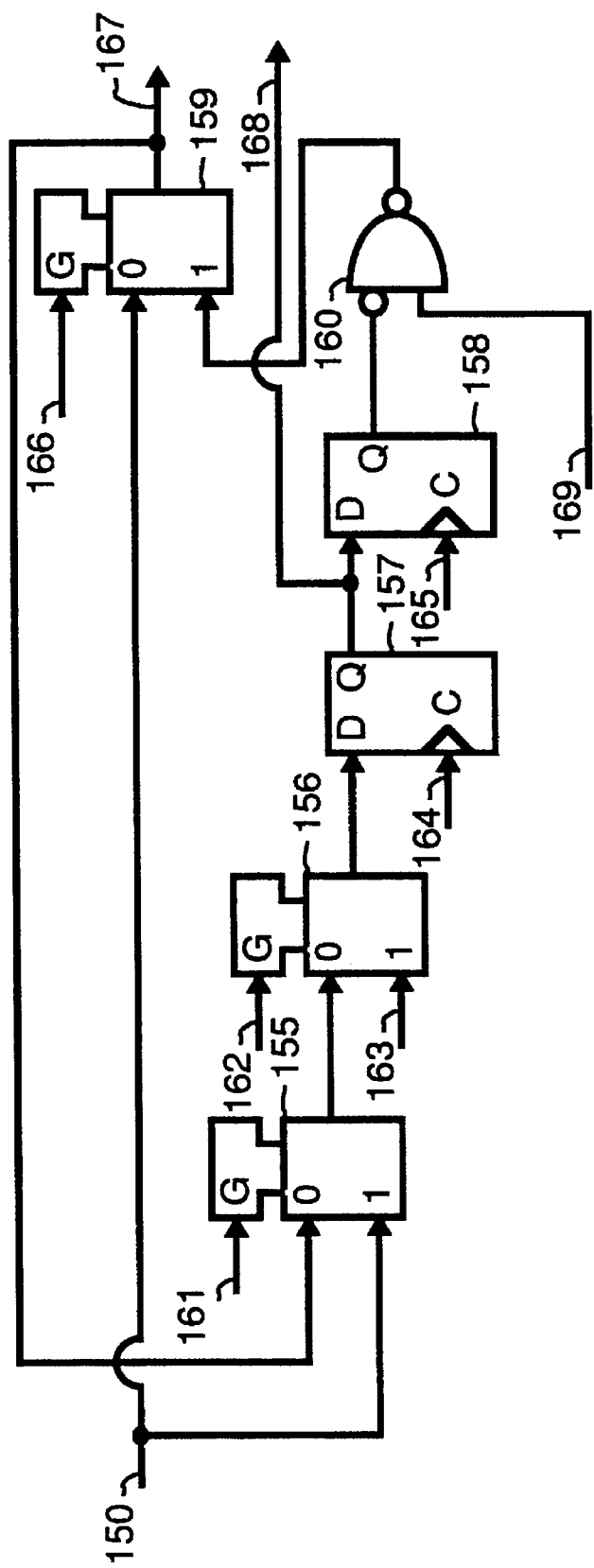
FIG. 7 shows a boundary scan register that can be connected to an enable control signal of a device in accordance with a preferred embodiment of the present invention.

FIG. 7 shows a boundary scan register that can be connected to an enable control signal of a device in accordance with a preferred embodiment of the present invention. The enable pin boundary scan register supports both controllability and observability for the output enable (oen) signal controlling tri-state and/or bi-directional pins, as described above in the discussions of the tri-state boundary scan register (FIG. 5) and the bi-directional boundary scan register (FIG. 6). The enable boundary scan register includes a D flip-flop 157 which operates as a shift stage and another D flip-flop 158 operates as an update stage. A Clock-DR signal on line 164 is used to clock D flip-flop 157. An Update-DR clock signal on a line 165 is used to clock D flip-flop 158. The output of flip-flop 157 is connected to the D input of flip-flop 158. A scan out signal is placed on a line 168. A multiplexor 159 selects either data from a core out line 150 or data from a logic NAND gate 160 to generate a signal for an output enable (oen) signal 167. Logic NAND gate 160 performs a logic NAND operation on the inverted output of D flip-flop 158 and a Mode-three signal line 169. Multiplexor 159 is controlled by a Mode-one line 166. A multiplexor 156 selects either data from a multiplexor 155 or data from a scan-in line 163 to place as input to D flip-flop 157. Multiplexor 156 is controlled by a Shift/Load mode line 162. Multiplexor 155 selects either data from output enable (oen) signal 167 or data from core-out line 150 to forward to multiplexor 156. Multiplexor 155 is controlled by a Mode-two line 161.

Figure 8:
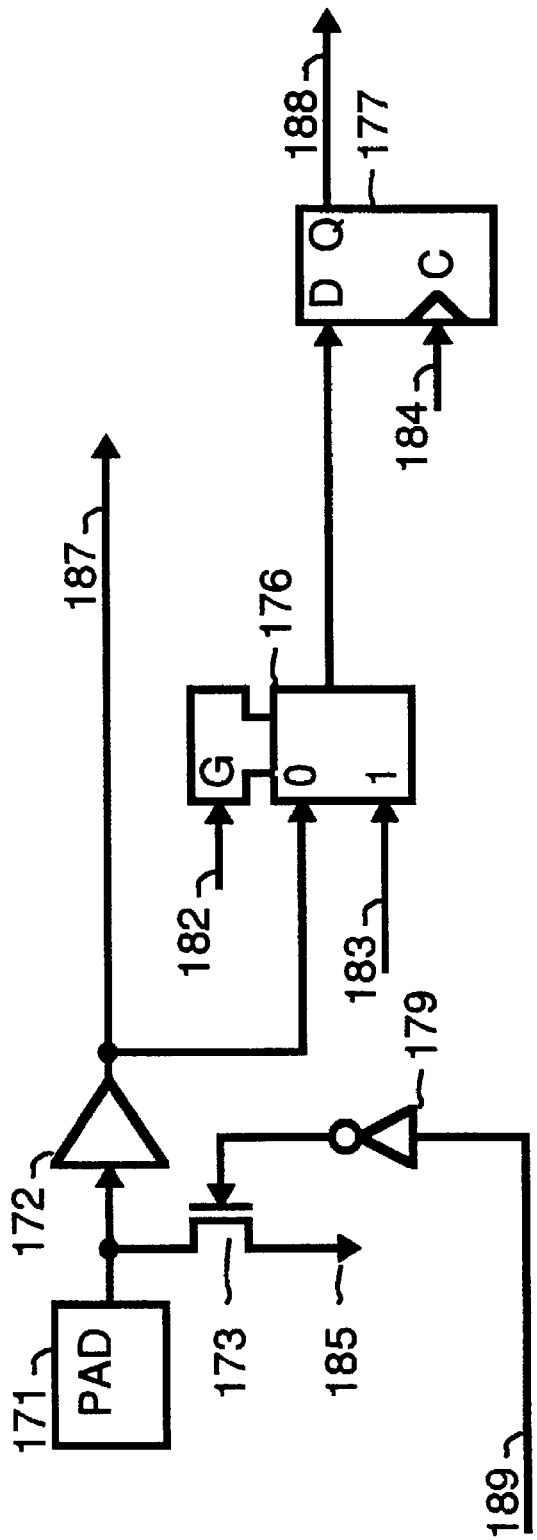
FIG. 8 shows a boundary scan register that can be used for observe only of an input signal of a device in accordance with a preferred embodiment of the present invention.

FIG. 8 shows a boundary scan register that can be used for observe only of an input signal of a device in accordance with a preferred embodiment of the present invention. The observe-only input pin boundary scan register supports observability for the input signal without controllability. This is used, for example, for an input pin which receives a system clock.

The observe-only input pin boundary scan register includes a D flip-flop 177 which operates as a shift stage. A Clock-DR signal on line 184 is used to clock D flip-flop 177. A scan out signal is placed on a line 188. A multiplexor 176 selects either data from an amplifier 172 or data from a scan-in line 183 to place as input to D flip-flop 177. Multiplexor 176 is controlled by a Shift/Load mode line 182.

The remaining circuitry within the observe-only input pin boundary scan register are used to provide a logic value on pad 171 during the test period. This prevents input pad 171 from floating during testing. This alleviates the need for input pad to be driven by the pin electronics of an automatic test equipment machine.

A WS line 189 is used through a not gate 179 to control a transistor 173. When transistor 173 is turned on, the a ground voltage on ground line 185 is applied to pad 171. Amplifier 172 is used to forward the logic value on pad 171 to multiplexor 176 and an output line 187.

Figure 9:
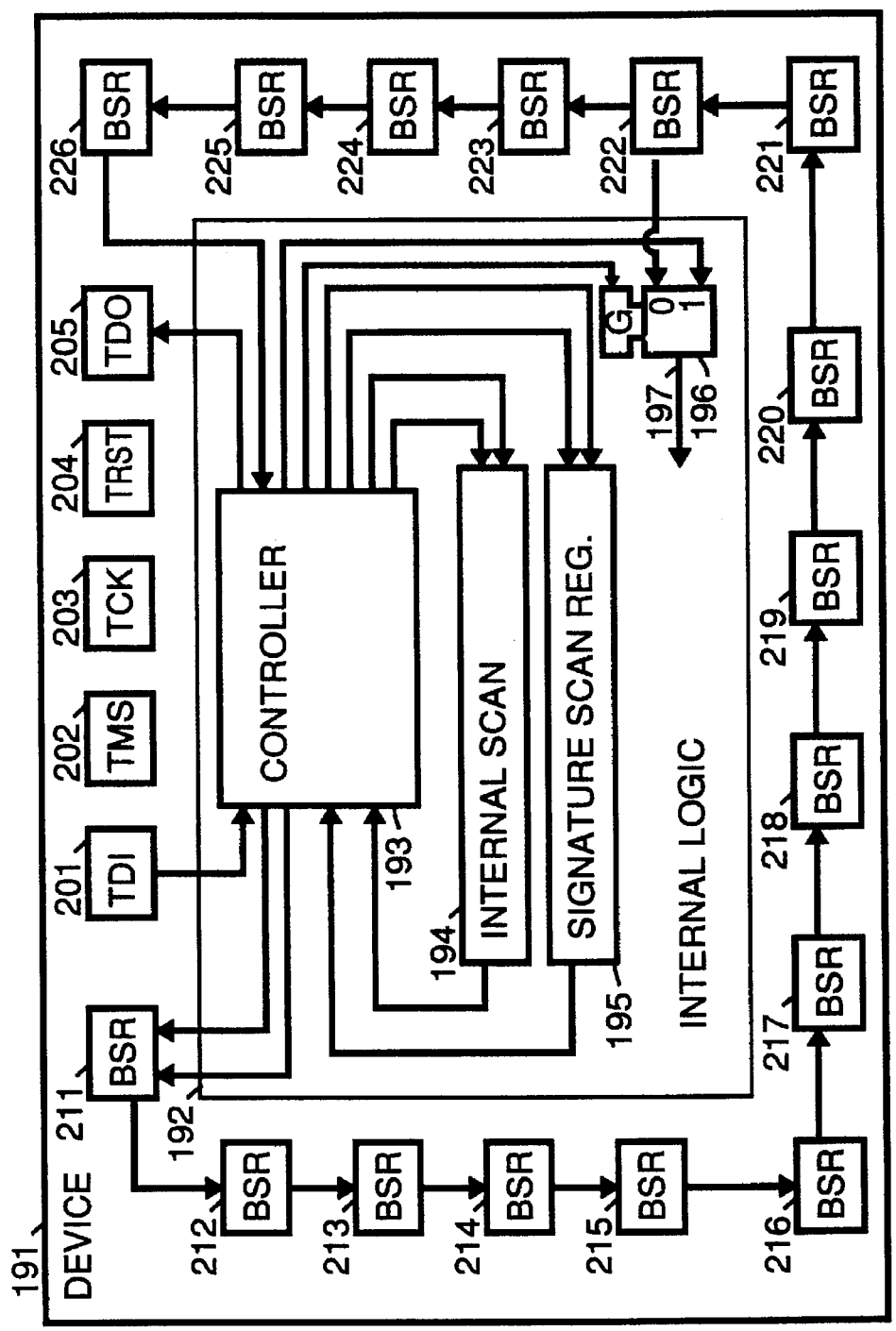
FIG. 9 shows an integrated circuit which utilizes boundary scan registers.

FIG. 9 shows selected internal logic within an integrated circuit which utilizes boundary scan registers. A device 191 includes internal logic 192. The internal logic includes a controller 193 which is, for example, an IEEE 1149.1a test access port (TAP) controller. Controller 193 utilizes a TDI controller port 201, a TMS controller port 202, a TCK controller port 203, an optional TRST controller port 204, a TDO controller port 205. Internal logic 192 also includes an internal scan register 194, a signature BIST (built in self test) scan register 195 for memory testing and a multiplexor 196. Device 191 includes various boundary scan registers. The boundary scan registers are represented in FIG. 9 by a boundary scan register 211, a boundary scan register 212, a boundary scan register 213, a boundary scan register 214, a boundary scan register 215, a boundary scan register 216, a boundary scan register 217, a boundary scan register 218, a boundary scan register 219, a boundary scan register 220, a boundary scan register 221, a boundary scan register 222, a boundary scan register 223, a boundary scan register 224, a boundary scan register 225 and a boundary scan register 226.

Multiplexor 196 selects a system/test clock on a system/test clock line 197, the test clock (Test_Clk) is provided from controller 193 during test, and a system clock is provided by observe only input pin boundary scan register 222 during system mode. Multiplexor 196 is controlled by Clk-en signal. Multiplexor 196 allows a system clock to be generated by controller 193 during a test sequence, and thus alleviates the need for an ATE machine generated system clock during testing.

Device 191 may be tested during wafer sort test process by accessing TAP controller ports. For example, when controller 193 is an IEEE standard 1149.1a TAP controller, the controller ports accessed are TDI controller port 201, TMS controller port 202, TCK controller port 203, an optional TRST controller port 204, TDO output pad 205 and some of the VDD and VSS pads of device 191. Thus by connecting just a few pads to the pin electronics of an ATE machine, ATPG vectors can be scanned in through TDI controller port 201 and scanned out through TDO controller port 205. For example, if a device is designed with dense pad pitch, where wafer probing of all pads is constrained physically, then the controller ports can be maintained allowing reasonable physical access for limited probes testing.

The following test sequence can be adopted to test a device using boundary scan registers in accordance with a preferred embodiment of the present invention along with IEEE 1149.1a TAP controller logic, internal scan and a BIST register if implemented with a limited probes approach during wafer sort process.

Step 1

Controller 193 is reset. For example, when controller 193 is an IEEE standard 1149.1a TAP controller, controller 193 is reset either by a signal to TRST controller port 204 or by holding TMS controller port 202 high for five or more cycles of a clock signal on TCK controller port 203.

Step 2

Figure 10:
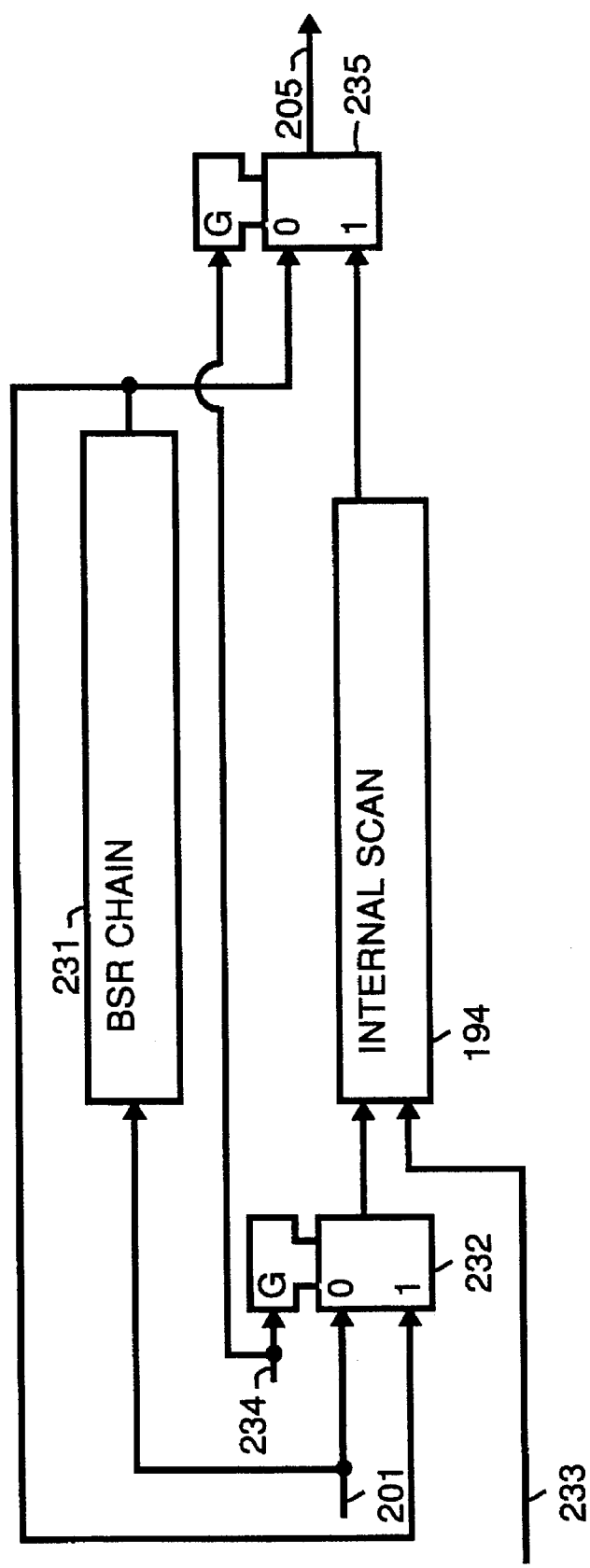
FIG. 10 shows connection between an internal scan chain and a boundary scan chain in accordance with a preferred embodiment of the present invention.
Figure 11:
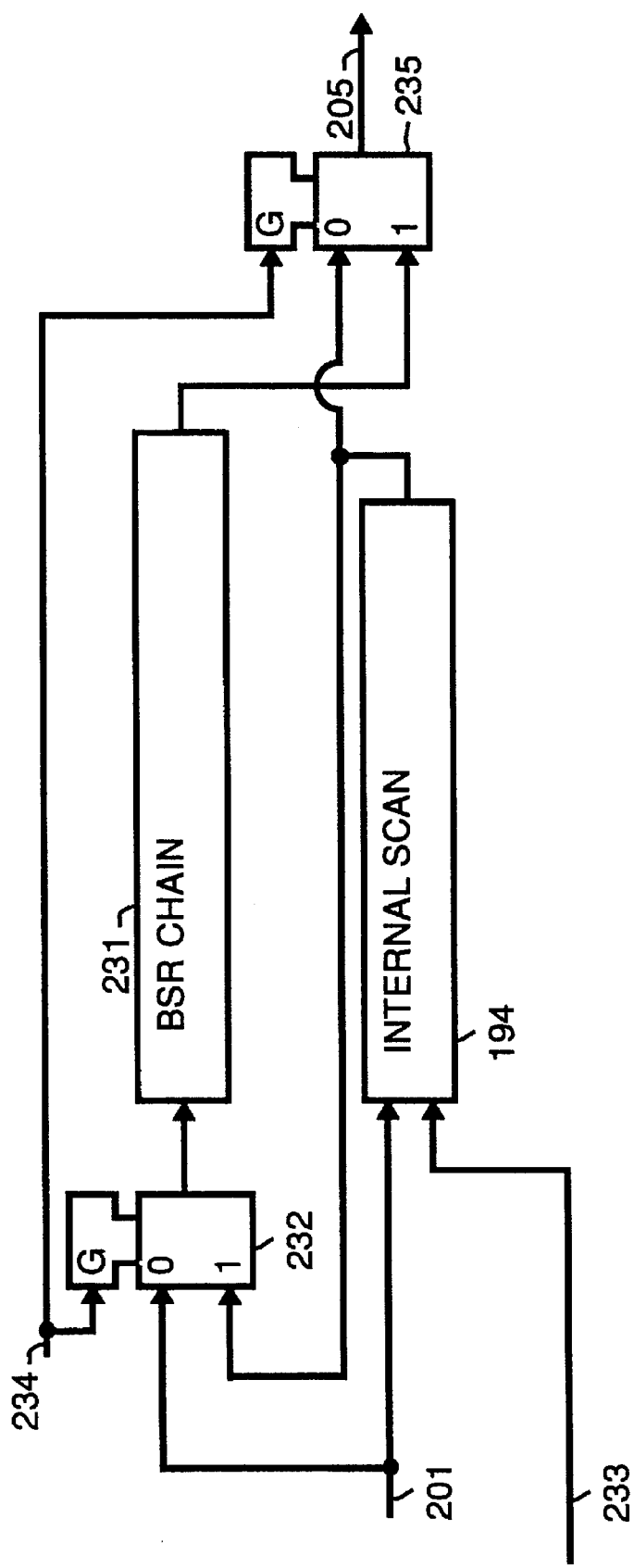
FIG. 11 shows connection between an internal scan chain and a boundary scan chain in accordance with an alternative preferred embodiment of the present invention.

For example, when controller 193 is an IEEE standard 1149.1a TAP controller, the instruction register is loaded with the WAFER_SORT instruction that cascades boundary scan chain and an internal scan chain, as shown in FIG. 10 or FIG. 11. The instruction register is loaded when controller 193 is in Shift-IR state. Multiplexors within controller 193 are used so that internal scan registers 194 and boundary scan registers 211 through 226 can be connected together in serial fashion. In this way ATPG vectors can be suitably formatted and scanned in through TDI controller port 201 and scanned out through TDO controller port 205.

Step 3

An ATPG vector is scanned into internal scan chain 194 and the parallel input stimuli is scanned into boundary scan registers 211 through 226. For example, when controller 193 is an IEEE standard 1149.1a TAP controller, this is done when controller 193 is in Shift-DR state.

Step 4

The parallel output response of internal logic of the device are captured into boundary scan registers 211 through 226. For example, when controller 193 is an IEEE standard 1149.1a TAP controller, the capture is performed by sequencing controller 193 through the following states: Shift-DR, Exit1-DR, Update-DR, Select-DR, Capture-DR, Exit1-DR, Pause-DR.

Step 5

The result is captured by internal scan register 194. For example, when controller 193 is an IEEE standard 1149.1a TAP controller, TCK controller port 203 is pulsed to capture the internal logic response of the device into internal scan register 194 in Pause-DR state and controller 193 is sequenced to Shift-DR through Exit2-DR state.

Step 6

The device response captured in boundary scan registers 211 through 226 and internal scan chain 194 are scanned out and compared with the ATPG expected values while scanning in the next vector. For example, when controller 193 is an IEEE standard 1149.1a TAP controller, this is done when controller 193 is in Shift-DR state.

Step 7

Steps four through six are repeated until all ATPG vectors are verified.

Step 8

If implemented, the signature of BIST scan register 195 is scanned out and verified. For example, when controller 193 is an IEEE standard 1149.1a TAP controller, RUNBIST instruction is loaded into instruction register in Shift-IR state, a BIST seed is scanned into signature scan register 195 through TDI controller port 201 when controller 193 is in Shift-DR state. The required number of clock pulses are applied through TCK controller port 203 when controller 193 is in RTI state. The contents of signature scan register 195 is then scanned out through TDO controller port 205 when controller 193 is in Shift-DR state.

Table 1 below gives Boolean expressions which can be used to derive BSR control signals for the various mode lines used to support the above-described limited probes device test methodology. The BSR control signals are derived from the logic signals of an IEEE standard 1149.1a TAP controller.

TABLE 1

| | |
|---|---|
| Shift/Load = | Shift-DR * (SAMPLE/PRELOAD + EXTEST + INTEST + RUNBIST + WAFER_SORT) |
| Clock-DR = | (Cap-DR + Shift-DR) * !(TCK) * (SAMPLE/ PRELOAD + EXTEST + INTEST + RUNBIST + WAFER_SORT) |
| Update-DR = | Up-DR * !(TCK) |
| Mode-one = | EXTEST + INTEST + RUNBIST + CLAMP + HIGHZ + (WAFER_SORT * !(Cap-DR)) |
| Mode-two = | EXTEST + INTEST |
| Mode-three = | (other than HIGHZ instruction) |
| WS = | WAFER_SORT |
| Scan enable = | WAFER_SORT * Shift-DR |
| BIST enable = | RUNBIST * RTI |
| Clk_en = | WAFER_SORT |
| Test_Clk = | WAFER_SORT * ((Shift-DR * !(TCK)) + (Pause-DR * !TMS * TCK)) |

FIG. 10 shows connection between internal scan chain 194 and a boundary scan register chain 231, which represents the boundary scan registers 211–226 shown in FIG. 9. A multiplexor 232 is used to select an input to internal scan register chain 194. A multiplexor 235 is used to select an output for TDO output pad 205. A WS line 234 is used to control multiplexors 232 and 235. TDI controller port 201 is used as input to BSR chain 231 and multiplexor 232. A scan enable signal 233 is also used as input to control internal scan register chain 194.

FIG. 11 shows an alternate connection between internal scan register chain 194 and boundary scan register chain 231. Multiplexor 232 is used to select an input to boundary scan register chain 231. Multiplexor 235 is used to select an output for TDO output pad 205. WS line 234 is used to control multiplexors 232 and 235. TDI controller port 201 is used as input to internal scan chain 194 and multiplexor 232.

Scan enable signal 233 is also used as input to control internal scan register chain 194.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

I claim:

1. A method for testing an integrated circuit when input/output pads of the integrated circuit are unconnected to any external device, the method comprising:
   (a) providing for each of a subset of the unconnected input/output pads, a boundary scan register, the boundary scan registers being connected serially;
   (b) scanning a test vector serially into the boundary scan registers; and,
   (c) applying the test vector to internal logic of the integrated circuit, including;
      (c.1) applying the test vector to the subset of the unconnected input/output pads.

2. A method as in claim 1 additionally comprising the following step:
   (d) receiving a response vector of internal logic of the integrated circuit, including:
      (c.1) applying the response vector to the subset of the unconnected input/output pads.

3. A method as in claim 2 additionally comprising the following step:
   (e) scanning the response vector serially out of the boundary scan registers.

4. A boundary scan register for an associated pad of a device, the boundary scan register comprising:
   a storage means for storing a value for the boundary scan register;
   a scan in means for scanning the value into the boundary scan register serially from a previous boundary scan register;
   a scan out means for scanning the value out of the boundary scan register serially to a next boundary scan register;
   an output of the boundary scan register on which the value is placed; and,
   gating means, coupled to the output and to the associated pad for gating the value to the associated pad during testing.

5. A boundary scan register, as in claim 4 wherein the associated pad is an input pad.

6. A boundary scan register as in claim 4 additionally comprising:
   an input selection means for selecting the output of the boundary scan register as providing input to the boundary scan register.

7. A boundary scan register as in claim 4 wherein the associated pad is an output pad separated from the boundary scan register by a tri-state gate.

8. A boundary scan register as in claim 7 additionally comprising:
   an input selection means for selecting the output of the tri-state gate as providing input to the boundary scan register.

9. A boundary scan register as in claim 4 additionally comprising:
   an amplifier having an input and an output, the input being coupled to the associated pad;
   a first multiplexor having an output, having a first input coupled to the output of the amplifier and having a second input coupled to the output of the boundary scan register;
   a second multiplexor having an output, having a first input coupled to the output of the first multiplexor and having a second input coupled to the scan in means; and,
   a third multiplexor having an output coupled to the output of the boundary scan register, having a first input coupled to the output of the amplifier, and having a second input;
   wherein the storage means includes:
      a first D flip-flop, having an output coupled to the scan out means, and having an input coupled to the output of the second multiplexor, and
      a second D flip-flop, having an output coupled to the second input of the third multiplexor means, and having an input coupled to the output of the first D flip-flop.

10. A boundary scan register as in claim 4 additionally comprising:
   a tri-state gate having an input coupled to the output of the boundary scan register and having an output coupled to the associated pad;
   a first multiplexor having an output, having a first input coupled to the output of the tri-state gate and having a second input coupled to an output of core logic for the device;
   a second multiplexor having an output, having a first input coupled to the output of the first multiplexor and having a second input coupled to the scan in means; and,
   a third multiplexor having an output coupled to the input of the tri-state gate, having a first input coupled to the output of core logic for the device, and having a second input;
   wherein the storage means includes:
      a first D flip-flop, having an output coupled to the scan out means, and having an input coupled to the output of the second multiplexor, and
      a second D flip-flop, having an output coupled to the second input of the third multiplexor means, and having an input coupled to the output of the first D flip-flop.

11. A boundary scan register for an associated pad of a device, the boundary scan register comprising:
   a storage means for storing a value for the boundary scan register;
   a scan in means for scanning the value into the boundary scan register serially from a previous boundary scan register;
   a scan out means for scanning the value out of the boundary scan register serially to a next boundary scan register;
   an output of the boundary scan register on which the value is placed; and,
   an input selection means for selecting the output of the boundary scan register as providing input to the boundary scan register.

12. A boundary scan register as in claim 11 wherein the associated pad is an output pad separated from the boundary scan register by an amplifier.

13. A boundary scan register as in claim 11 additionally comprising:

an amplifier having an input coupled to the output of the boundary scan register and having an output coupled to the associated pad;

a first multiplexor having an output, having a first input, and having a second input coupled to the scan in means; and, a second multiplexor having an output coupled to the input of the amplifier, having a first input coupled to an output of core logic for the device, and having a second input;

wherein the storage means includes:

a first D flip-flop, having an output coupled to the scan out means, and having an input coupled to the output of the first multiplexor, and a second D flip-flop, having an output coupled to the second input of the second multiplexor means, and having an input coupled to the output of the first D flip-flop; and, wherein the input selection means is a third multiplexor having a first input coupled to the output of core logic for the device, having a second input coupled to the output of the amplifier, and having an output coupled to the first input of the first multiplexor.

* * * * *